United States Patent

Yada et al.

[11] Patent Number: 4,745,358
[45] Date of Patent: May 17, 1988

[54] AUXILIARY DISPLAYING DEVICE OF A DIGITAL METER DISPLAY

[75] Inventors: Takaaki Yada; Tadao Nakamura; Ichiro Asano, all of Minami, Japan

[73] Assignee: Horiba, Ltd., Kyoto, Japan

[21] Appl. No.: 815,997

[22] Filed: Jan. 2, 1986

[30] Foreign Application Priority Data

Feb. 7, 1985 [JP] Japan .................................. 60-23179

[51] Int. Cl.$^4$ .......................... G01R 17/06; G06F 3/14
[52] U.S. Cl. ................................. 324/99 D; 324/133; 324/102; 340/753; 340/754
[58] Field of Search ............. 324/157, 133, 102, 99 D; 340/660, 661, 662, 715, 753, 980, 970, 977; 307/354, 358, 359; 328/127

[56] References Cited

U.S. PATENT DOCUMENTS 3,359,410 12/1967 Frisby et al. ...................... 324/102
4,295,136 10/1981 Stoutenburg .................... 340/753 X
4,311,994 1/1982 Kuribayashi ..................... 340/661 X
4,507,795 3/1985 Wagner ........................... 307/358 X Primary Examiner—Reinhard J. Eisenzopf
Assistant Examiner—Vinh P. Nguyen
Attorney, Agent, or Firm—Wenderoth, Lind & Ponack

[57] ABSTRACT

The direction of change of an analog signal which is digitally displayed on a digital display can be immediately determined at a glance by providing a change-display in the vicinity of the digital display, which digitally displays the analog signal value. The change-display displays whether the analog input signal is increasing or decreasing by comparing the present value of the input signal with a previous value thereof. This comparison may be effected by integrating the input signal and comparing the integrated input signal with the input signal or by differentiating the input signal or by using a sample and hold circuit to hold a previous input signal value which is then compared with the present input signal value.

4 Claims, 2 Drawing Sheets

AUXILIARY DISPLAYING DEVICE OF A DIGITAL METER DISPLAY

BACKGROUND OF THE INVENTION

1. Field of the Invention

The present invention relates to an auxiliary displaying device by which the direction of change of a displayed value of a digital meter can be immediately determined at a glance.

2. Description of the Prior Art

Digital meters are now widely being used in instruments, meters and the like. But, with meters of this kind, since the numerals displayed change with a change of inputs, it is frequently difficult to determine at a glance whether the numerals are changing in an increasing direction or a decreasing direction.

On the contrary, a "digi-ana" method, in which an analog meter is provided together with a digital meter and a determination as to whether a signal is increasing or decreasing can be made by means of the analog meter, is also known.

However, since digital and analog meter are provided side by side in the above described "digi-ana" method, a problem occurs in that the displaying space becomes large, and the circuit becomes complicated in construction and therefore becomes expensive.

SUMMARY OF THE INVENTION

The object of the present invention is to provide an auxiliary displaying device which is simple in construction, inexpensive, and can eliminate the abovenoted displaying defect of a digital meter.

To this end, according to the present invention, a determination as to whether an analog input signal is increasing or decreasing is displayed in a change-display provided in the vicinity of a numeral-display on the basis of the change of the analog input which was previously detected.

According to the above described construction, the changing state of numerals displayed on the numeral-display can be immediately determined at a glance. Since the change of an analog input is detected, the circuit is simple in construction by a device of this type thereby becomes inexpensive.

BRIEF DESCRIPTION OF THE DRAWINGS

The embodiments of the present invention are illustrated in the attached drawings, in which.

DESCRIPTION OF THE PREFERRED EMBODIMENTS

One embodiment of the present invention is below described with reference to FIGS. 1 and 2.

Figure 1:
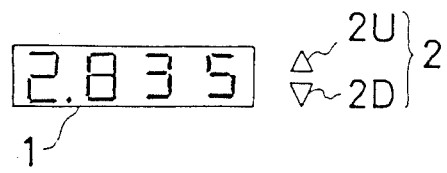
FIG. 1 is a plan view showing a numeral-display and a change-display.

Referring now to FIG. 1 showing a displaying portion, numeral 1 designates a numeral-display for displaying an analog input in the form of a digital value, numerals (0 to 9) of each figure being displayed by means of segments comprising light-emitting diodes (LED's), for example. Numeral 2 designates a state-display provided in the vicinity of said numeral-display 1 and provided with displays 2U and 2D each having a triangular shape and arranged so as to point in opposite directions. The displays 2U and 2D may comprise LED's, for example.

Figure 2:
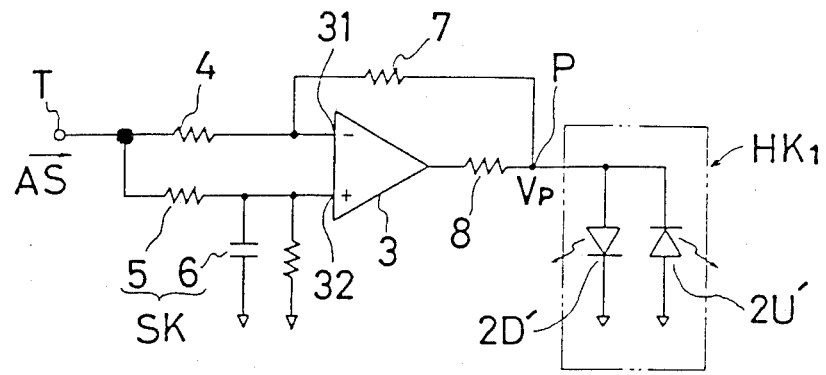
FIGS. 2 to 5 are circuit diagrams showing the construction of various change-detecting circuits.

FIG. 2 shows one example of a change-detecting circuit for detecting the change of an analog input and lighting one of the displays 2U and 2D on the basis of the detection result. The difference between an instantaneous value and an integrated value of the analog input is amplified by an operational amplifier and one of the displays 2U and 2D is lit, depending upon the polarity of the output voltage of the operational amplifier. That is, referring to FIG. 2, numeral 3 designates an operational amplifier having one input terminal 31 which is connected to a signal input terminal T through an input resistor 4 whereby an instantaneous value of an analog input AS fed to the signal input terminal T is directly input to the input terminal 31. On the other hand, an input terminal 32 of the operational amplifier 3 is connected to the signal input terminal T through an integrating circuit SK consisting of a resistor 5 and a capacitor 6 whereby the integrated value of the analog input AS is input to the input terminal 32 after a time delay whose delay time is related to a time constant determined by the resistor 5 and the capacitor 6. Numeral 7 designates a feed-back resistance and numeral 8 is an output resistor. A displaying circuit $HK_1$ is connected to an output P of the operational amplifier 3. The displaying circuit $HK_1$ is composed of LED's 2U' and 2D', which are luminous elements of the display 2U and 2D, and which are connected in parallel with their polarities reversed.

With the change-detecting circuit constructed in the above described manner, a voltage $V_p$ at the output P of the operational amplifier 3 is zero when the analog input AS is stabilized but the voltage $V_p$ becomes a negative value with an increase (i.e.—a change to a more positive value) of the analog input AS while the voltage $V_p$ is changed to a positive value with a decrease (i.e.—a change to a more negative value) of the analog input AS. At this time, if the voltage $V_p$ corresponds to at least the forward voltage of one of the LED's 2U' or 2D', then the LED 2U' or 2D' is lit. That is to say, the LED 2U' emits light when the analog input AS is increasing while the LED 2D' emits light when the analog input AS is decreasing whereby either 2U or 2D of FIG. 1 is lit.

Figure 3:
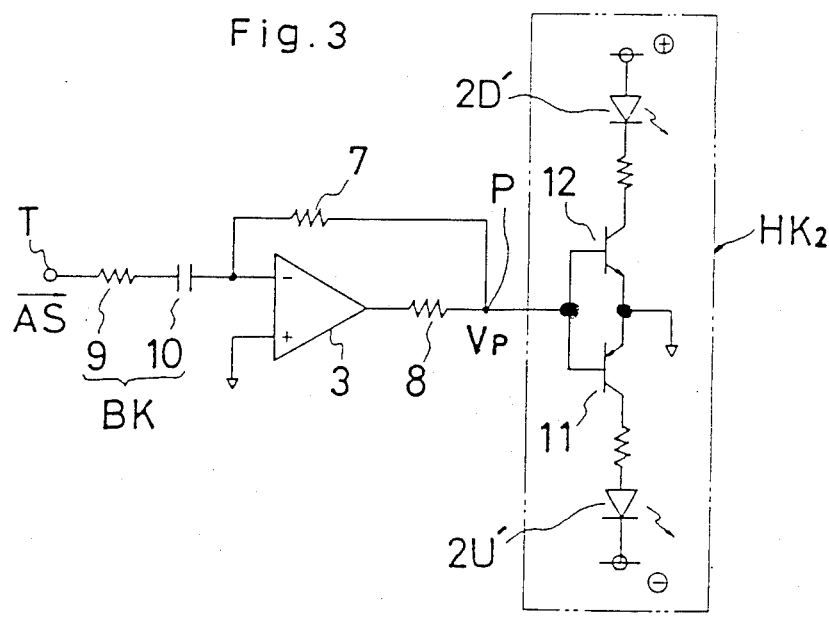
Figure 4:
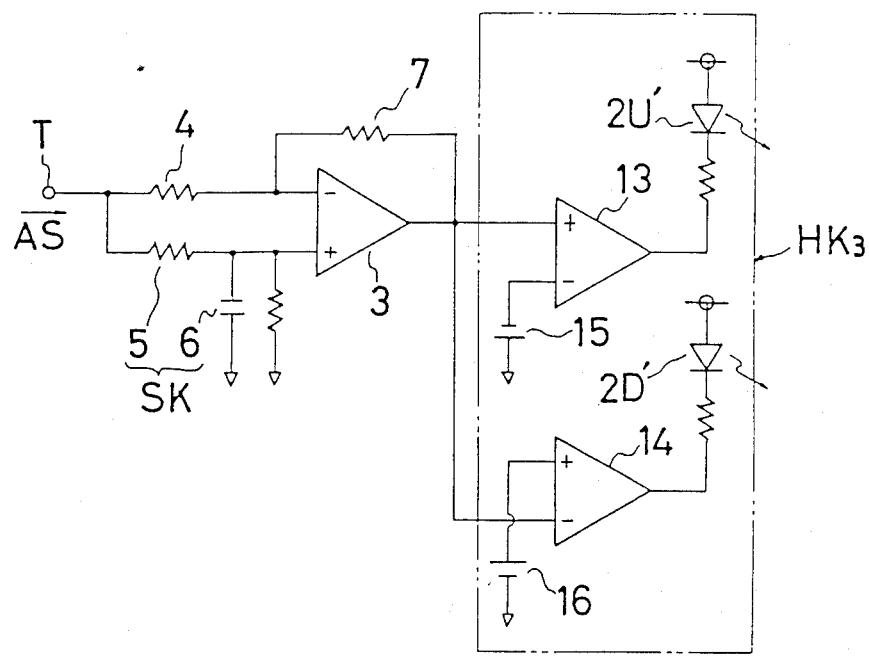
Figure 5:
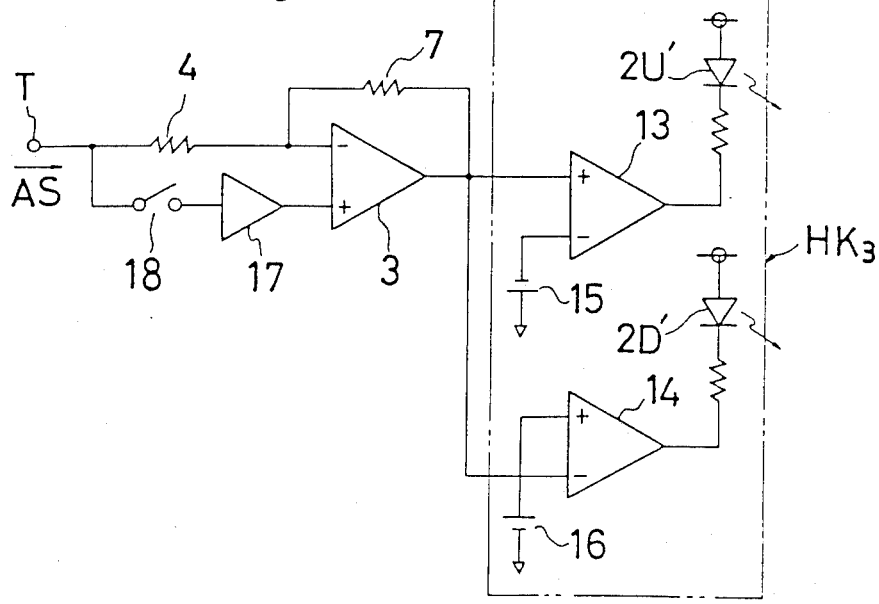

FIGS. 3 to 5 show other embodiments of the present invention. FIG. 3 illustrates a circuit for increasing an amount of light emitted by the LED's 2U' and 2D'. BK designates a differentiator circuit consisting of a resistor 9 and a capacitor 10 and $HK_2$ designates a display circuit consisting of a PNP transistor 11, an NPN transistor 12 and LED's 2U' and 2D'. A detailed description of operation is omitted for the sake of brevity but an ON-OFF control is carried out by a voltage between the base and emitter of the transistors 11 and 12.

In addition, the integrating circuit SK of FIG. 2 may be used in place of the differentiator circuit BK of FIG. 3. Also, the display circuit $HK_1$ may be used in place of the display circuit $HK_2$.

In FIG. 4, a display circuit $HK_3$ is provided with comparators 13 and 14. Numerals 15 and 16 designate power sources for providing reference voltage. The remainder of the circuit is similar to that shown in FIG. 2.

The LED's 2U' and 2D' are respectively lit when the output of the operational amplifier is more negative than the potential of power source 15 and more positive than the potential of power source 16. Neither LED would be lit for small variations in the magnitude of input voltage AS, thereby avoiding false indications due to electrical noise.

In FIG. 5 a holding amplifier 17 is provided on an input of the operational amplifier 3 to compare a value of the analog input AS before holding with a present instantaneous value of the analog input AS. In addition, 18 designates a switch which is controlled by additional circuitry which has not been shown in the drawings for the sake of brevity.

Furthermore, the shape of the change-display 2 is not limited to one shown in FIG. 1.

We claim:

1. An auxiliary display device for use in conjunction with a digital meter display comprising:
    a means for receiving an analog input signal;
    a slope detection means operatively connected to said receiving means for determining whether said analog input signal is increasing in value or decreasing in value with respect to time;
    first and second display means which are disposed physically adjacent to the digital meter display and which are operatively electrically connected to said slope detection means for respectively indicating whether said analog input signal is increasing or decreasing in value with respect to time, whereby the direction of change of the value of said analog signal with respect to time which is being digitally displayed on said digital display may be immediately determined at a glance.

2. An auxiliary displaying device as recited in claim 1, wherein said slope detection means comprises an integrator means connected to said receiving means for integrating said analog input signal and a comparator means having one input connected to an output of said integrator means and a second input connected to said receiving means.

3. An auxiliary displaying device as recited in claim 1, wherein said slope detection means comprises a differentiator means having its input electrically connected to said receiving means and having its output electrically connected to an input of a comparator means which has another input connected to ground.

4. An auxiliary displaying device as recited in claim 1, wherein said slope detection means comprises a sample and hold means having an input connected to said receiving means and having an output connected to one input of a comparator means which has another input connected to said receiving means.

* * * * *